(12) United States Patent
Yoshida et al.

(10) Patent No.: US 7,888,671 B2
(45) Date of Patent: Feb. 15, 2011

(54) SEMICONDUCTOR DEVICE

(75) Inventors: Hidehiro Yoshida, Osaka (JP); Hisao Nagai, Osaka (JP); Yoshiro Kitamura, Osaka (JP)

(73) Assignee: Panasonic Corporation, Osaka (JP)

(*) Notice: Subject to any disclaimer, the term of this patent is extended or adjusted under 35 U.S.C. 154(b) by 348 days.

(21) Appl. No.: 12/159,485

(22) PCT Filed: Dec. 14, 2007

(86) PCT No.: PCT/JP2007/074133

§ 371 (c)(1),
(2), (4) Date: Jun. 27, 2008

(87) PCT Pub. No.: WO2008/075625

PCT Pub. Date: Jun. 26, 2008

(65) Prior Publication Data

US 2010/0213442 A1 Aug. 26, 2010

(30) Foreign Application Priority Data

Dec. 18, 2006 (JP) ............................. 2006-339651

(51) Int. Cl.
*H01L 29/08* (2006.01)
(52) U.S. Cl. ........... 257/40; 257/E51.018; 257/E27.117
(58) Field of Classification Search .................. 257/40, 257/72, 81, 99, E51.005, E51.018, E27.117, 257/E21.007; 313/504, 505, 506; 438/22, 438/222, 30, 48; 345/92
See application file for complete search history.

(56) References Cited

U.S. PATENT DOCUMENTS 5,596,208 A * 1/1997 Dodabalapur et al. ......... 257/66

2005/0029646 A1 2/2005 Ueda et al.

(Continued)

FOREIGN PATENT DOCUMENTS

EP 0 989 778 * 3/2000

(Continued)

OTHER PUBLICATIONS

English language Abstract of JP 2007-35981, Feb. 8, 2007.

(Continued)

*Primary Examiner*—Thomas L Dickey
*Assistant Examiner*—Nikolay Yushin
(74) *Attorney, Agent, or Firm*—Greenblum & Bernstein, P.L.C.

(57) ABSTRACT

Provided is a semiconductor device comprising an organic semiconductor element A and an organic semiconductor element B, wherein
the organic semiconductor element A has a source electrode and a drain electrode disposed on a surface of a substrate; a channel gap disconnecting the source electrode and the drain electrode; an organic semiconductor layer disposed on the source electrode, the drain electrode and the channel gap; an insulating film disposed on the organic semiconductor layer; a gate electrode disposed on the insulating film; a bank defining the organic semiconductor layer; a and groove through the bank,
a distance between the apex of the bank and the surface of a substrate is greater than a distance between the apex of the channel gap and the surface of the substrate, and
the organic semiconductor element B has a source electrode or a drain electrode connected with the gate electrode of the organic semiconductor element A via the groove through the bank of the organic semiconductor element A.

9 Claims, 9 Drawing Sheets

U.S. PATENT DOCUMENTS

| | | |
|---|---|---|
| 2005/0039673 A1 | 2/2005 | Ishida |
| 2005/0196969 A1 | 9/2005 | Gunner et al. |
| 2006/0006378 A1 | 1/2006 | Hirai |
| 2006/0261371 A1 | 11/2006 | Kuroda et al. |
| 2007/0031990 A1 | 2/2007 | Maekawa |
| 2007/0166855 A1* | 7/2007 | Lee et al. ............ 438/29 |
| 2007/0205481 A1 | 9/2007 | Ishida |
| 2008/0088020 A1 | 4/2008 | Miyajima et al. |

FOREIGN PATENT DOCUMENTS

| | | |
|---|---|---|
| JP | 2004-330164 | 11/2004 |
| JP | 2005-522000 | 7/2005 |
| JP | 2006-100808 | 4/2006 |
| JP | 2006-245582 | 9/2006 |
| JP | 2007-35981 | 2/2007 |
| WO | 2004/030072 | 4/2004 |

OTHER PUBLICATIONS

English language Abstract of JP 2004-330164, Nov. 25, 2004.
English language Abstract of JP 2005-522000, Jul. 21, 2005.

* cited by examiner

SEMICONDUCTOR DEVICE

TECHNICAL FIELD

The present invention relates to a semiconductor device and a method of producing the same.

BACKGROUND ART

A semiconductor device using an organic semiconductor as an active layer is calling attention. The semiconductor device using the organic semiconductor is advantageous also for cost reduction because it is possible to form the active layer by applying the organic semiconductor material at a low temperature. Further, it is now possible to pattern and to form, not only the active layer, but also a gate insulating film layer, a source electrode, a drain electrode, and further a gate electrode, by applying a material that can be applied.

By forming the active layer and the like by a coating method, reduction of producing cost can be realized, and further it will become also possible to produce a semiconductor device including a flexible substrate having no heat resistance such as a plastic material.

In a coating method such as an inkjet method, material having a low viscosity is applied to a substrate and the like. In order to pattern a low-viscosity material by a coating method, a physical boundary is required to define a domain to be coated. Accordingly, a method of forming a bank around the domain to be coated is proposed in a coating method such as an inkjet method.

In Patent Document 1, there is described a method of forming an electrode by applying an electrode material to a domain enclosing a source electrode and a drain electrode, where the domain is defined by a bank on a substrate formed by nano-imprint (see Patent Document 1).

Further, in Patent Document 2, there is described a method of producing an organic semiconductor element by applying an electrode material and an organic semiconductor material to a domain enclosing a source electrode, a drain electrode and an active layer, where the domain is defined by a bank formed on a substrate by a photolithographic method (see Patent Document 2).

Patent Document 1: Japanese Patent Laid-Open Publication No. 2007-35981

Patent Document 2: Japanese Patent Laid-Open Publication No. 2006-245582

DISCLOSURE OF THE INVENTION

Problems to be Solved by the Invention

An organic EL display contains plural organic luminescent elements arranged in a matrix-state. Usually, two or more organic semiconductor elements (TFT) connected with each other are required for driving the organic luminescent elements. The two or more organic semiconductor elements contain at least one driving TFT and one switching TFT. In general, a drain electrode of the switching TFT is connected with a gate electrode of the driving TFT via a conductive layer. Further, a drain electrode of the driving TFT is connected with a pixel electrode of the organic luminescent elements via a conductive layer. So far, two TFTs were, for example, connected via a contact hole, and no attempt has been made to form the conductive layer connecting the two TFTs by a coating method.

An object of the present invention is to produce a semiconductor device containing two or more organic semiconductor elements (a switching TFT and a driving TFT, for example) by a convenient process. Namely, a source electrode or a drain electrode of one organic semiconductor element is formed by coating together with a gate electrode of the other organic semiconductor element to produce a semiconductor device containing two or more organic semiconductor elements in a convenient process. In this way, an organic EL device is also produced in a convenient process.

Means for Solving the Problems

Namely, the first aspect of the present invention relates to a semiconductor device described in the following.

[1] Semiconductor device comprising an organic semiconductor element A and an organic semiconductor element B, wherein the organic semiconductor element A has a source electrode and a drain electrode disposed on a surface of a substrate; a channel gap disconnecting the source electrode and the drain electrode; an organic semiconductor layer disposed on the source electrode, the drain electrode and the channel gap; an insulating film disposed on the organic semiconductor layer; a gate electrode disposed on the insulating film; a bank defining the organic semiconductor layer; and a groove through the bank, a distance between the apex of the bank and the surface of a substrate is greater than a distance between the apex of the channel gap and the surface of the substrate, and the organic semiconductor element B has a source electrode or a drain electrode connected with the gate electrode of the organic semiconductor element A via the groove through the bank of the organic semiconductor element A.

[2] The semiconductor device described in [1], wherein the gate electrode of the organic semiconductor element A and the source electrode or the drain electrode of the organic semiconductor element B are disposed on a same plane.

[3] The semiconductor device described in [1], wherein the organic semiconductor element B has a gate electrode disposed on the surface of a substrate; an insulating film disposed on the gate electrode; a source electrode and a drain electrode disposed on the insulating film; an organic semiconductor layer disposed on the source electrode and the drain electrode; a bank defining the organic semiconductor layer; and a groove through the bank, which communicates with the groove through the bank of the organic semiconductor element A, and the gate electrode of the organic semiconductor element A is connected with the source electrode or the drain electrode of organic semiconductor element B via the groove for the communicating.

[4] The semiconductor device described in [1], wherein the width of the groove is 3 to 200 μm.

[5] A semiconductor device comprising an organic semiconductor element A and an organic semiconductor element B, wherein the organic semiconductor element A has a source electrode and a drain electrode disposed on a surface of a substrate; a channel gap disconnecting the source electrode and the drain electrode; an organic semiconductor layer disposed on the source electrode, the drain electrode and the channel gap; an insulating film disposed on the organic semiconductor layer; a gate electrode disposed on the insulating film; a bank defining the organic semiconductor layer; and a hole through the bank, a distance between the apex of the bank and the surface of the substrate is greater than a distance between the apex of the channel gap and the surface of the substrate, and the organic semiconductor element B has a gate electrode connected with the source electrode or the drain electrode of the organic semiconductor element A via the hole through the bank of the organic semiconductor element A.

[6] The semiconductor device described in [5], wherein the source electrode or the drain electrode of the organic semiconductor element A and the gate electrode of the organic semiconductor element B are disposed on a same plane.

[7] The semiconductor device described in [5], wherein the organic semiconductor element B has a gate electrode disposed on the surface of the substrate; an insulating film disposed on the gate electrode; a source electrode and a drain electrode disposed on the insulating film; an organic semiconductor layer disposed on the source electrode and the drain electrode; a bank defining the organic semiconductor layer; and a hole through the bank, which communicates with the hole through the bank of the organic semiconductor element A, and the source electrode or the drain electrode of the organic semiconductor element A is connected with the gate electrode of the organic semiconductor element B via the hole for the communicating.

[8] The semiconductor device described in [5], wherein the width of the hole is 3 to 200 μm and the height is 20 to 200 nm.

Further, the second aspect of the present invention relates to an organic EL device described in the following.

[9] An organic EL device comprising the semiconductor device described in [1] and an organic luminescent element having a pixel electrode connected to the drain electrode of the organic semiconductor element A.

[10] An organic EL device comprising the semiconductor device described in [5] and an organic luminescent element having a pixel electrode connected to the drain electrode of the organic semiconductor element B.

EFFECTS OF THE INVENTION

A convenient method of producing an organic semiconductor device is provided by forming a conductive layer connecting a driving TFT with a switching TFT using a coating method, and also a low-priced organic semiconductor device can be provided.

BEST MODE FOR CARRYING OUT THE INVENTION

Figure 1:
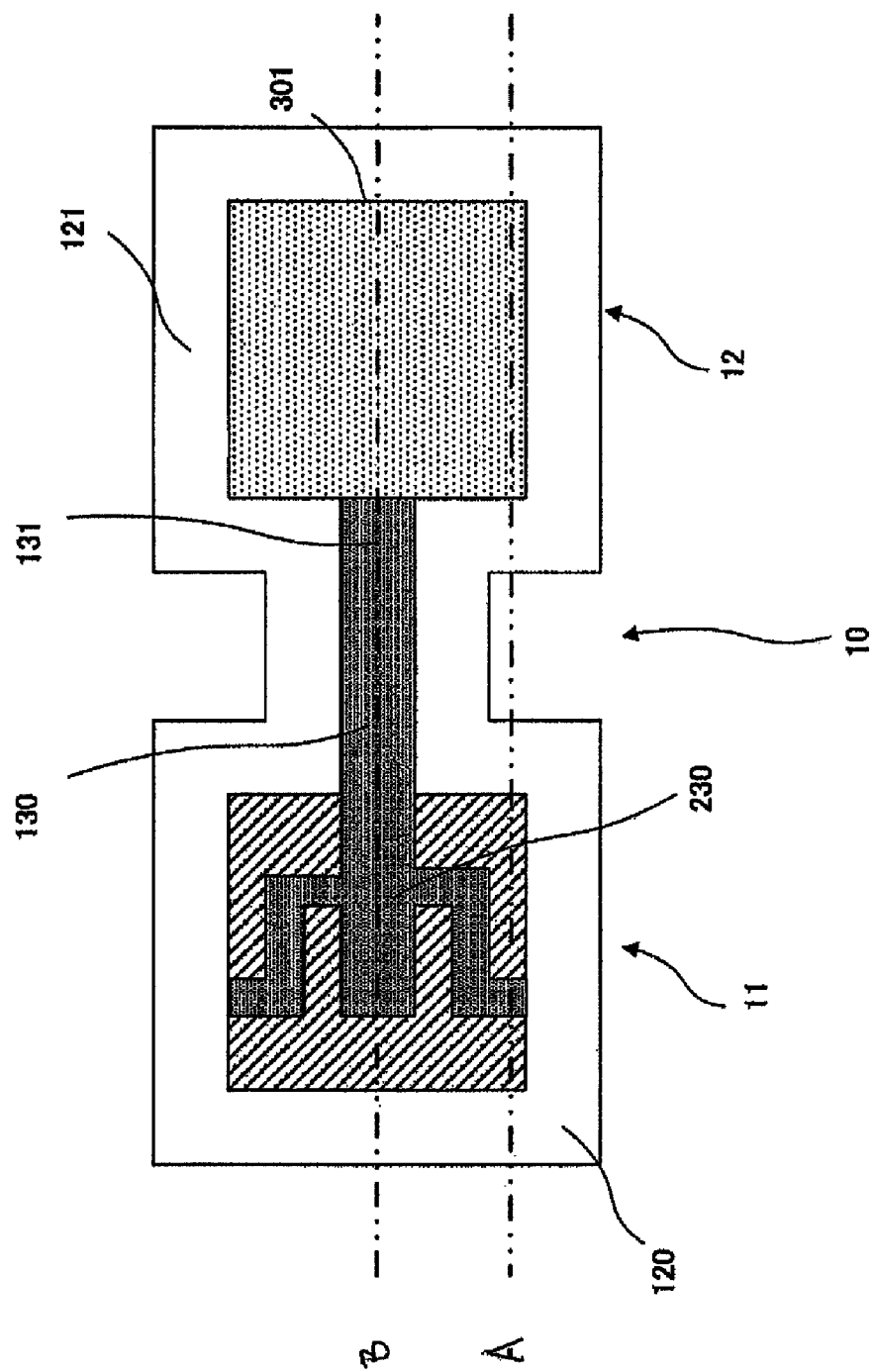
FIG. 1 is a plane view of a semiconductor device of the first embodiment.

The semiconductor device of the present invention has an organic semiconductor element A (hereinafter also referred to as "the element A") and an organic semiconductor element B (hereinafter also referred to as "the element B"), and a gate electrode, a drain electrode or the like of element A is connected with a drain electrode or the like, or gate electrode of element B.

1. Organic Semiconductor Element A

The element A in the semiconductor device of the present invention has a source electrode, a drain electrode, a channel gap, an organic semiconductor layer, a gate insulating film and a bank. The element A is a top gate-type TFT element.

The substrate is composed of an insulating material. Examples of the insulating material include glass and a resin. Examples of the resin include polyethylene terephthalate (PET), polyethylene naphthalate (PEN), polyethersulfone (PES), polyether imide, polyphenylenesulfide (PPS), polyarylate, polyimide, polycarbonate (PC), polyacrylate (PAR), cellulose triacetate, cellulose acetate propionate (CAP), and the like.

The substrate is preferably processable by imprinting and therefore the substrate is preferably a resinous substrate.

The source electrode and the drain electrode are conductive layers disposed on the substrate. Materials of the source electrode and the drain electrode may be either a conductive polymer or a metal. Examples of the conductive polymer include polyethylene dioxythiophene (PEDOT), polyaniline (PANI) and the like. Examples of the metal include Ag, Cu, Au, Pt and the like. The thickness of the source electrode and the drain electrode may be chosen appropriately and is preferably 20 to 200 nm.

The source electrode and the drain electrode are formed, for example, by baking a material containing metal nanoparticles or carbon nanoparticles and an organic binder after they are applied to a domain defined by a channel gap and a bank described later. Examples of the metal nanoparticles include Ag nanoparticles, Cu nanoparticles, Au nanoparticles, Pt nanoparticles or the like.

The channel gap is an insulating member disposed between a source electrode and a drain electrode on the substrate. The domain enclosing the source electrode and the drain electrode is defined by the channel gap and a bank described later. The material of the channel gap may be the same as that of the substrate. The height of the channel gap (the distance between the apex of the channel gap and the surface of a substrate) is preferably 0.01 to 10 μm. The width of the channel gap (the space between the source electrode and the drain electrode) is preferably 1 to 5 μm.

The channel gap may be formed on the substrate by photolithography, but the channel gap is preferably formed simultaneously with a bank by carrying out an imprinting process to the substrate (described later). The imprinting process includes thermal imprinting process and photo-imprinting process. The thermal imprinting process is a technology of molding a heated substrate by a mold press. The photo-imprinting process is a technology of forming a photo-curable resin dropped on a substrate by a mold press followed by light exposure and curing. In either case, imprinting process is carried out by pressing with a mold for imprinting. By forming the channel gap and the bank by imprinting, the domain enclosing the source electrode, the drain electrode and the organic semiconductor layer can be patterned without using photolithography process. Accordingly, variation of the semiconductor device can be reduced and a substantial cost reduction can be accomplished.

The organic semiconductor layer is disposed on the source electrode, the drain electrode and the channel gap within a domain defined by a bank (described later).

Examples of the material of the organic semiconductor layer include pentacene, tetracene, anthracene, naphthalene, $\alpha$-6-thiophene, $\alpha$-4-thiophene, perylene and a derivative thereof, rubrene and a derivative thereof, coronene and a derivative thereof, perylenetetracarboxylic diimide and a derivative thereof, perylenetetracarboxylic dianhydride and a derivative thereof, poly(paraphenylene vinylene) and a derivative thereof, polyfluorene and a derivative thereof, poly(para-phenylene) and a derivative thereof, oligoacene of naphthalene and a derivative thereof, oligoacene of $\alpha$-5-thiopene and a derivative thereof, pyromellitic dianhydride and a derivative thereof, pyromellitic diimide and a derivative thereof, parylenetetracarboxylic dianhydride and a derivative thereof, phthalocyanine and a derivative thereof, naphthalene tetracarboxylic diimide and a derivative thereof, naphthalene tetracarboxylic dianhydride and a derivative thereof, conjugated polymer derivative containing substituted or unsubstituted thiophene, conjugated polymer derivative containing substituted fluorene, and the like. The material of the organic semiconductor layer is preferably soluble pentacene.

The thickness of the organic semiconductor layer is not limited in particular, and is set so as not to exceed the height of the bank. As a rule, the thickness of the organic semiconductor layer is 2 to 100 nm.

The organic semiconductor layer is formed preferably by applying an organic semiconductor material (coating method). Examples of the coating method include an inkjet method, dispensing method and the like.

The gate insulating film is an insulating member disposed on the organic semiconductor layer. The material of the gate insulating film may be either an inorganic substance or an organic insulating substance. Examples of the organic insulating substance include benzocyclobutene (BCB), polyimide, polyvinylphenol, parylene and the like. The thickness of the gate insulating film is chosen appropriately. The gate insulating film may be formed by applying the above-mentioned substances to the organic semiconductor layer by using, for example, the inkjet method, the dispensing method and the like.

The gate electrode is a conductive layer disposed on the gate insulating film. The material of the gate electrode may be the same as that of the source electrode or the drain electrode.

The gate electrode is formed, for example, by baking a material containing metal nanoparticles or carbon nanoparticles and an organic binder after they are applied to domain defined by a bank described later. Examples of the metal nanoparticles include Ag nanoparticles, Cu nanoparticles, Au nanoparticles, Pt nanoparticles and the like.

The bank is an insulating member defining the domain enclosing the organic semiconductor layer and the gate insulating film. The material of the bank is preferably the same as that of the substrate. The height of the bank (the distance between the apex of the bank and the surface of a substrate) is preferably larger than the height of channel gap. The height (depth) of the bank is preferably 0.1 to 5 μm.

The bank of the semiconductor device of the present invention is characterized by being provided with a groove or a hole. The groove through the bank enables a connection between the gate electrode of the element A and the drain electrode or the source electrode (hereinafter referred to as "the drain electrode or the like") of the element B. The groove through the bank is formed at a part of the bank in order to enable connection between the gate electrode of the element A and the drain electrode or the like of the element B described later. The gate electrode of the element A is connected with the drain electrode or the like of the element B preferably on a same plane. Further, the hole through the bank enables connection between the drain electrode or the like of the element A and the gate electrode of the element B. The hole is formed on a part of the bank in order to enable connection between the drain electrode or the like of the element A and the gate electrode of the element B. The drain electrode or the like of the element A is connected with the gate electrode of the element B preferably on a same plane.

The width of the groove is preferably so narrow as to prevent organic semiconductor material to be applied from inflowing into the groove. On the other hand, the material of the electrode (source/drain electrode or gate electrode) to be applied preferably inflows into the groove. Therefore, the groove width is preferably 3 to 200 μm and more preferably 50 to 100 μm.

The bottom surface of the groove is preferably on the same plane with the bottom surface of the gate electrode of the element A and the bottom surface of the drain electrode or the like of the element B. By bringing these surfaces on the same plane, the gate electrode of the element A and the drain electrode or the like of the element B can be formed together by coating. The groove depth depends on the bank depth and is usually 0.1 to 5 μm.

The width of the hole is preferably also 3 to 200 μm and more preferably 50 to 100 μm. The height of the hole is preferably 20 to 200 nm.

The bottom surface of the hole is preferably on the same plane with the bottom surface of the drain electrode or the like of the element A and the bottom surface of the gate electrode of the element B. By bringing these surface on the same plane, the drain electrode or the like of the element A and the gate electrode of the element B can be formed together by coating.

The bank and the groove formed through the bank are formed preferably simultaneously with the channel gap by nano-imprinting as described above. By forming the bank using nano-imprinting, the domain enclosing the organic semiconductor, the insulating film and the gate electrode can be patterned without a light exposure process, which will serve to reduce the variation of the organic semiconductor device and also the production cost.

2. Organic Semiconductor Element B

The element B is preferably provided with a substrate, a gate electrode, a gate insulating film, a source electrode and a drain electrode, a channel gap, an organic semiconductor layer, and further a bank same as in the case of the element A. The function of each member may be the same as that in the case of the element A. In addition, the element B is usually a bottom gate type organic TFT element.

The material of the substrate may be the same as that of the element A. The element A and element B preferably share one substrate.

The gate electrode in the element B is preferably disposed on the substrate. The material and the like of the gate electrode may be the same as those of the gate electrode of the element A. In the case where the bank described later has a hole, the gate electrode is connected with the drain electrode or the like of the element A on a same plane via the hole.

The gate insulating film is disposed on the gate electrode. The material and its thickness of the film may be the same as those of the gate insulating film of the element A.

The channel gap is formed between the source electrode and the drain electrode on the insulating film. The height and width of the channel gap may be the same as those of the channel gap of the element A. The material of the channel gap in the element B is not particularly limited, and may be the same as that of the insulating film. The channel gap in the element B is preferably formed by nano-imprinting the insulating film, but may be formed by a photolithographic method.

The source electrode and the drain electrode are disposed on the gate insulating film. The material of the source electrode and the drain electrode may be the same as that of the source electrode and the drain electrode of the element A. In the case where the bank has a groove, the drain electrode or the like of the element B is connected with the gate electrode of the element A on a same plane via the groove.

The height of the bank may be the same as that of the bank of the element A. The bank is provided with a groove or a hole same as in the case of the bank of the element A. The groove or the hole is connected with the groove or the hole through the bank of the element A. Further, the groove or the hole is formed in such a manner that the gate electrode, or the drain electrode or the like of the element A can be connected with the drain electrode or the dike, or the gate electrode of the element B. The gate electrode or, the drain electrode or the like of the element A is connected with the drain electrode or the gate electrode of the element B preferably on a same plane. The width and depth of the groove and the width and height of the hole may be the same as those of the groove and the hole of the element A.

The organic semiconductor layer is disposed on the source electrode, the drain electrode and the channel gap. The material and its thickness may be the same as those of the organic semiconductor layer of the element A.

3. The Relation Between the Element A and the Element B

The element A and the element B are disposed side by side on a substrate in the present invention. In the present invention, the gate electrode of the element A is characterized by being connected with the drain electrode or the like of the element B on a same plane via the groove formed through the bank, or the drain electrode or the like of the element A is characterized by being connected with the gate electrode of the element B on a same plane via the hole. By making the element A as a top-gate type organic TFT and the element B as a bottom-gate type organic TFT, the gate electrode, or the drain electrode or the like of the element A can be connected with the drain electrode or the like, or the gate electrode of the element B on a same plane without complicating the structure of each element (see FIG. 2 and FIG. 7).

In this way, since the gate electrode, or the drain electrode or the like of the element A and the drain electrode or the like, or the gate electrode of the element B are disposed on a same plane while being connected, they can be formed together by applying an electrode material using an inkjet method and the like. Accordingly, the number of processes for producing a semiconductor device can be reduced.

The organic semiconductor device can be applied to an organic EL element. Namely, by using the element A or element B as a driving TFT, a pixel electrode of an organic luminescent element (including the pixel electrode, a cathode and an organic luminescent layer sandwiched between them) is connected to the drain electrode of the element A or element B. The organic luminescent element can be driven in this way (see FIG. 9).

In the following, embodiments of the present invention will be explained with reference to the drawings. Note, however, that the embodiments described in the following do not limit the scope of the present invention.

First Embodiment

Figure 2A:
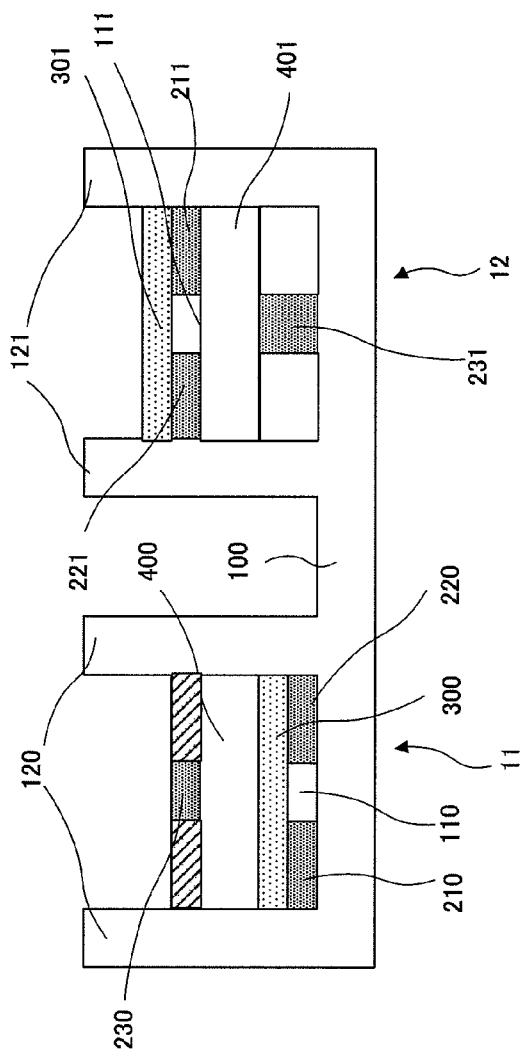
FIG. 2A is a cross-sectional view of line A across the semiconductor device of the first embodiment and FIG. 2B is a cross-sectional view of line B across the semiconductor device of the first embodiment.
Figure 2B:
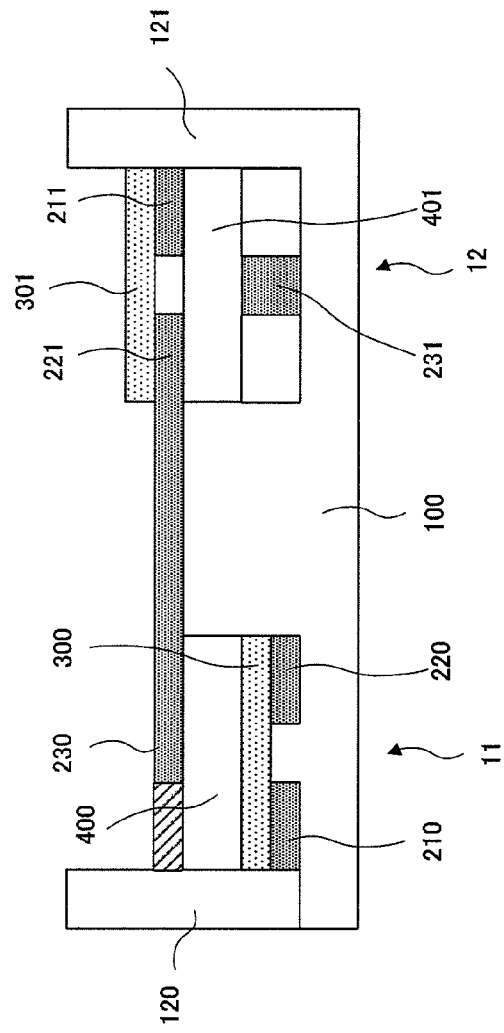

A semiconductor device having a groove through a bank is explained in the first embodiment. FIG. 1 shows a plane view of the semiconductor device in the first embodiment. FIGS. 2A and 2B each show a cross-sectional view of the semiconductor device in the first embodiment.

In FIGS. 1 and 2, a semiconductor device 10 is provided with a top-gate type TFT 11 and a bottom-gate type TFT 12.

1. The Top-Gate Type TFT 11

The top-gate type TFT 11 is provided with a substrate 100, a source electrode 210 and a drain electrode 220, a channel gap 110, an organic semiconductor layer 300, a gate insulating film 400, a gate electrode 230, and a bank 120.

The substrate 100 is a PET film, for example. The source electrode 210 and the drain electrode 220 are disposed on the substrate 100. The material of the source electrode 210 and the drain electrode 220 is silver, for example.

The channel gap 110 is disposed between the source electrode 210 and the drain electrode 220. The material of the channel gap is PET, for example. The height of the channel gap is 0.01 to 10 µm and width of the channel gap is 1 to 50 µm. The organic semiconductor layer 300 is disposed on the source electrode 210, the drain electrode 220 and the channel gap 110. The gate insulating film 400 is disposed on the organic semiconductor layer 300. The gate electrode 230 is disposed on the gate insulating film 400. The material of the gate electrode 230 is silver, for example.

The bank 120 is disposed on the substrate so as to define a domain enclosing the gate electrode 230, the gate insulating film 400 and the organic semiconductor layer 300. Further, a groove 130 is formed through the bank 120 (FIG. 1). The groove 130 is connected with a groove 131 of the bottom-gate type TFT 12 described later (FIG. 2B). Through the groove 130 and the groove 131, the gate electrode 230 and a drain electrode 221 of the bottom-gate type TFT 12 can be disposed on a same plane while they are connected.

The height of the bank 120 is 0.1 to 5 µm. The width of the groove 130 formed through the bank is 3 to 200 µm and the depth of the groove 130 formed is 0.1 to 5 µm. The material of the bank 120 is PET, for example.

2. Bottom-Gate Type TFT 12

The bottom-gate type TFT 12 is provided with a substrate 100, a gate electrode 231, a gate insulating film 401, a source electrode 211 and a drain electrode 221, a channel gap 111, an organic semiconductor layer 301, and a bank 121.

The substrate 100 of the bottom-gate type TFT 12 is the same as the substrate of the top-gate type TFT 11, which means that the bottom-gate type TFT 12 and the top-gate type TFT 11 share the substrate 100. The gate electrode 231 is disposed on the substrate 100. The material of the gate electrode 231 is silver, for example. The gate insulating film 401 is disposed on the gate electrode 231. The source electrode 211 and the drain electrode 221 are disposed on the gate insulating film 401. The material of the source electrode 211 and the drain electrode 221 is silver, for example.

The channel gap 111 is disposed between the source electrode 211 and the drain electrode 221. The height of the channel gap is 0.01 to 10 µm and width of the channel gap is 1 to 50 µm. The material of the channel gap 111 may be the same as the insulating film 401 or different from that of the insulating film 401. The organic semiconductor layer 301 is disposed on the source electrode 211, the drain electrode 221 and the channel gap 111.

The bank 121 is disposed on the substrate so as to define a domain enclosing the gate electrode 231, the gate insulating film 401 and the organic semiconductor layer 301. Further, a groove 131 is formed through the bank 121. The groove 131 is connected with the groove 130 of the top-gate type TFT 11 (FIG. 1). Through the groove 131 and the groove 130, the gate electrode 230 and the drain electrode 221 can be disposed on a same plane while they are connected. The width of the groove 131 formed through the bank 121 is preferably the same as that of the groove 130. In addition, the depth of the groove 131 formed through the bank 121 is preferably the same as that of the groove 130.

3. Method for Producing the Semiconductor Device 10

Figure 3A:
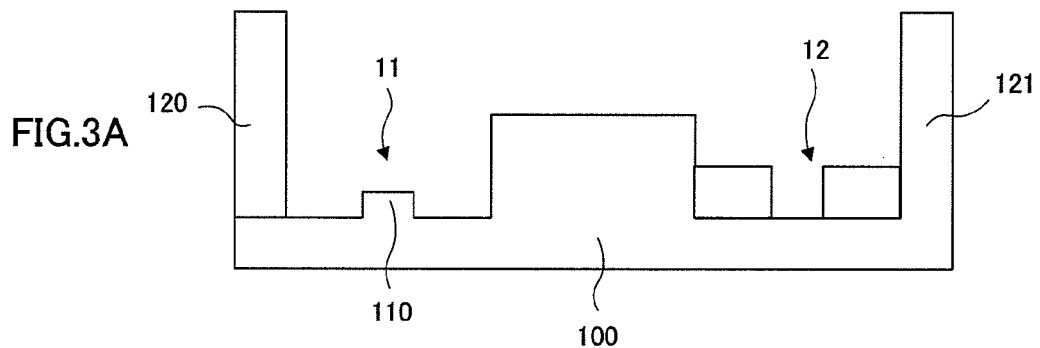
FIG. 3 is a diagram showing a production process of the semiconductor device of the first embodiment.
Figure 3B:
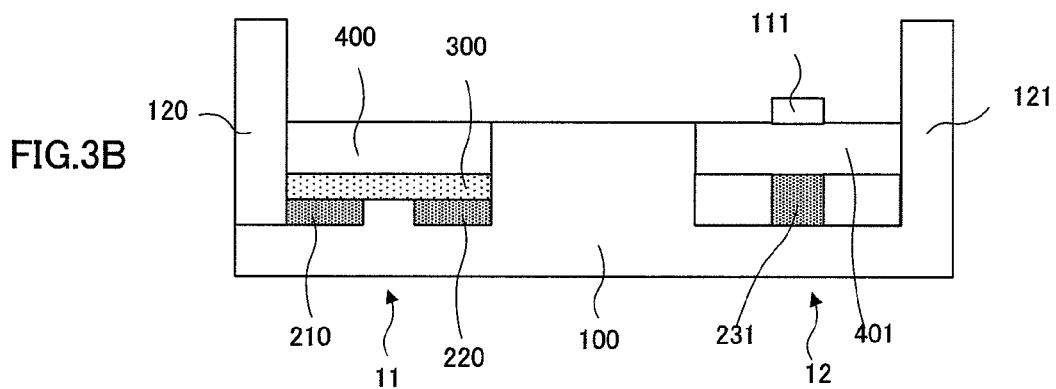
Figure 3C:
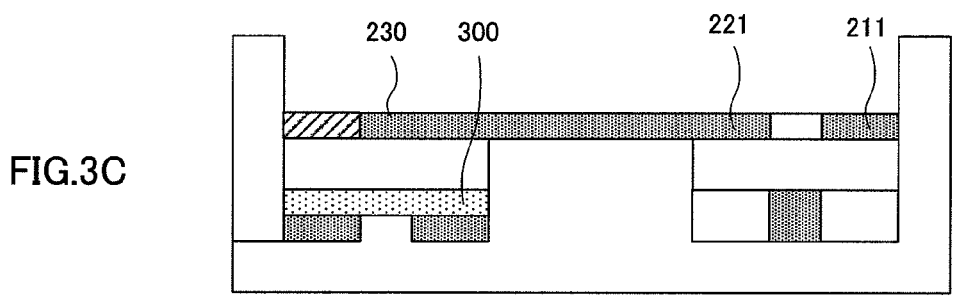
Figure 3D:
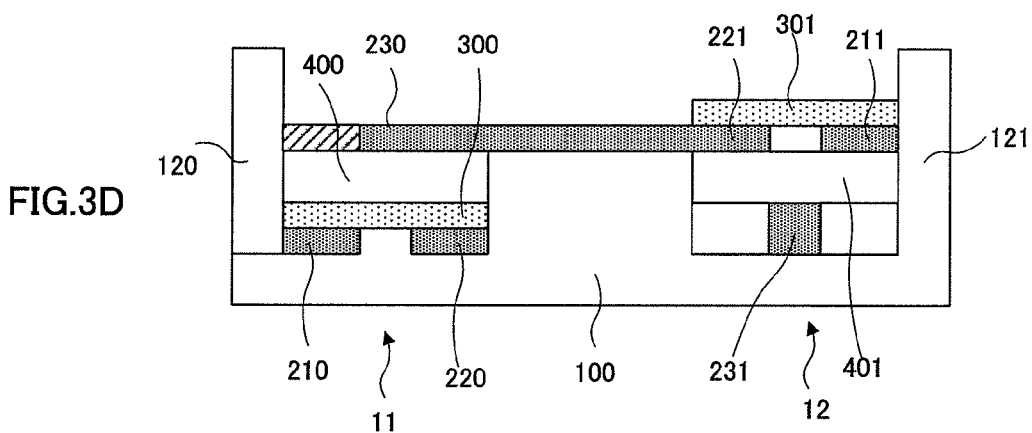

The method for producing the semiconductor device 10 includes, for example, steps of 1) forming the substrate 100 appropriately by an imprinting process (FIG. 3A),
2) forming the source electrode 210, the drain electrode 220, the channel gap 110, the organic semiconductor layer 300 and the gate insulating film 400 of the top-gate type TFT 11, and further forming the gate electrode 231, the gate insulating film 401 and the channel gap 111 of the bottom-gate type TFT (FIG. 3B), 3) forming the gate electrode 230, the drain electrode 221 and the source electrode 211 (FIG. 3C) and
4) forming the organic semiconductor layer 301 (FIG. 3D).

Step 1) is performed by forming the channel gap 110 and the bank 120 of the top-gate type TFT 11 by imprinting the substrate 100. The bank 121 of the bottom-gate type TFT 12 and, depending on a case, a recess defining a domain in which a gate electrode is formed may be formed. A mold for the imprint is made of silicon, silicon dioxide or carbon.

Step 2) includes a) forming a member of the top-gate type TFT 11 (FIGS. 4A to 4D), and b) forming a member of the bottom-gate type TFT 12 (FIGS. 5A to 5D). These are explained separately below.

Substep a)

Figure 4A:
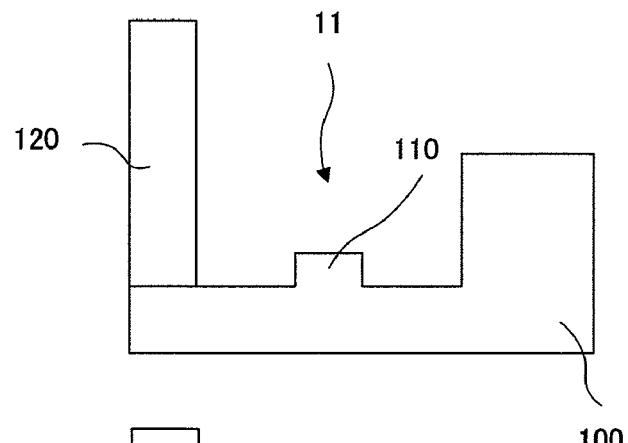
FIG. 4 is a diagram showing a part of the process for producing a top-gate type TFT of the semiconductor device of the first embodiment.

First, the substrate 100 is pressed with an imprint mold to form the channel gap 110 and the bank 120 (FIG. 4A). The imprint mold is made of, for example, silicon, silicon dioxide or carbon.

The upper surface of the channel gap 110 formed by the imprinting is preferably subjected to a water repelling treatment. The water repelling treatment is performed by applying a water repellent agent followed by drying. Examples of the water repellent agent include a fluorine-containing surfactant. By performing the water repelling treatment of the upper surface of the channel gap 110, the source electrode 210 and a drain electrode 220 (described later) formed by a coating method can be definitely isolated from each other to form a channel domain.

Figure 4B:
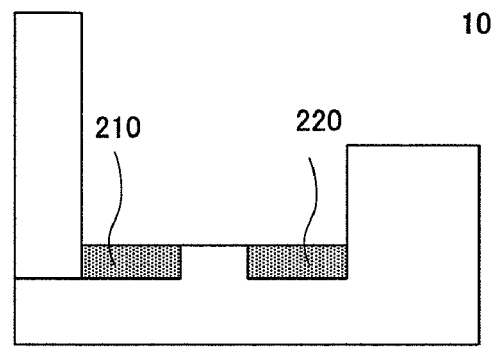

Next, an ink containing an electrode material (an ink containing Ag nanoparticles and an organic binder, for example) is applied to a domain defined by the channel gap 110 and the bank 120, by using an inkjet method and the like, and the applied ink is dried and solidified to form the source electrode 210 and the drain electrode 220 (FIG. 4B). The ink containing an electrode material may be applied using a die coating method, wherein the ink applied to the upper surface of the channel gap 110 may be removed by a squeegee. Drying of the applied ink should be carried out at a temperature at which the substrate 100 does not melt. When a resinous substrate is used as the substrate 100, the drying should be performed at a temperature lower than the glass transition temperature of the resin. The drying may be performed at about 50 to about 100° C. when using a PET substrate, and at 250° C. or less when using a PEN substrate.

As described above, in the case where the upper surface of the channel gap 110 has been subjected to a water repelling treatment, the water repelling property is removed after forming the source electrode 210 and the drain electrode 220. To remove the water repelling property, drying at a high temperature or washing (with ozonated water, for example) may be performed. Removing of the water repelling property may be performed at the same time with drying of the applied ink.

Figure 4C:
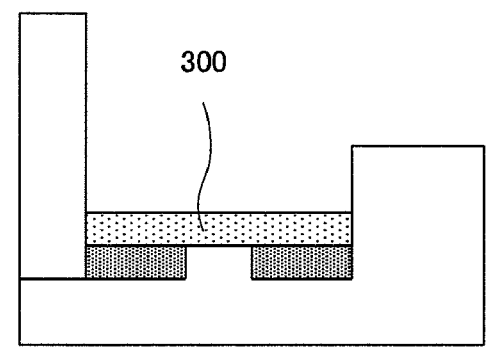

An ink containing an organic semiconductor material and a solvent is applied to the source electrode 210, the drain electrode 220 and the channel gap 110 within the domain defined by the bank 120, for example, by using an inkjet method. The applied ink is then dried and solidified to form the organic semiconductor layer 300 (FIG. 4C).

Figure 4D:
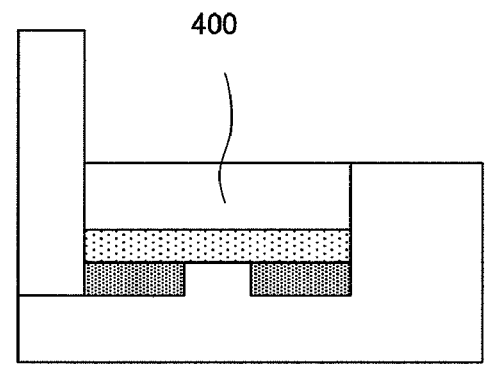

Subsequently, an insulating material is applied to the organic semiconductor layer 300 within the domain defined by the bank 120 (using an inkjet method, for example). The applied ink is then dried and solidified to form the gate insulating film 400 (FIG. 4D). Next, the gate electrode 230 is formed on the gate insulating film 400 by using a coating method (FIG. 3C). The gate electrode 230 may be formed over the whole of the gate insulating film 400 or may be formed only in the vicinity of the channel domain. In order to form the gate electrode at a desired location, the gate insulting film 400 may be patterned with a water repellent agent.

Substep b)

Figure 5A:
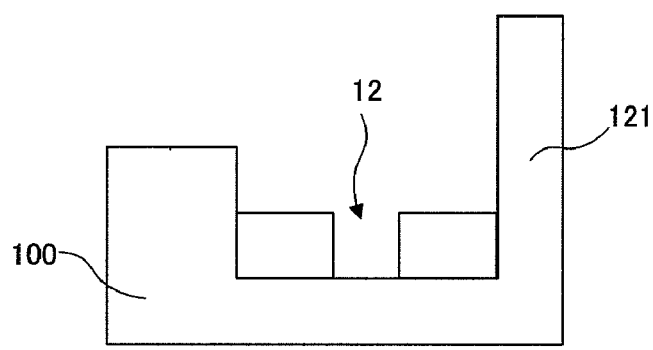
FIG. 5 is a diagram showing a part of the process for producing a bottom-gate type TFT of the semiconductor device of the first embodiment.

First, the substrate 100 is pressed with imprint mold to form a bank 121 (FIG. 5A). The imprint mold is made of, for example, silicon, silicon dioxide or carbon.

Figure 5B:
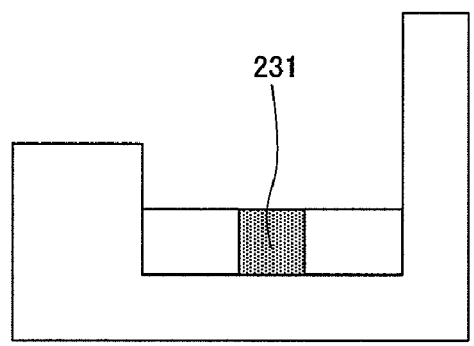

Next, an ink containing an electrode material (an ink containing Ag nanoparticles and an organic binder, for example) is applied to a domain defined by the bank 121, by using an inkjet method, for example. The applied ink is then dried and solidified to form a gate electrode 231 (FIG. 5B).

Figure 5C:
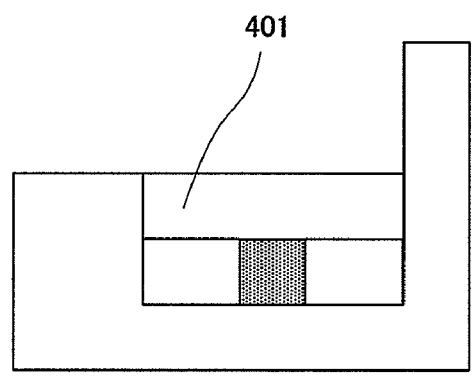

Subsequently, an insulating material is applied to the gate electrode 231 within the domain defined by the bank 121, by using an inkjet method for example. The applied ink is then dried and solidified to form a gate insulating film 401 (FIG. 5C).

Figure 5D:
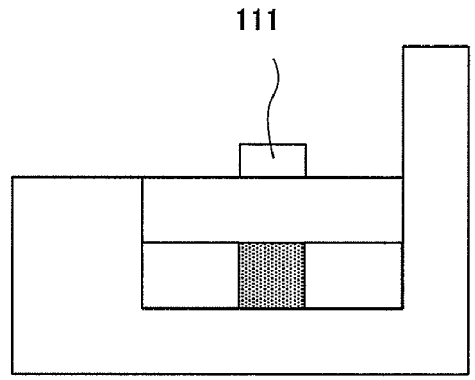

A channel gap 111 is formed on the gate insulating film 401 FIG. 5D). In the case where the insulating material of the gate insulting film 401 consists of thermo-deformable material (a polyimide resin and the like), the channel gap 111 can be formed by pressing the gate insulating film 401 with an imprint mold. Further, the channel gap 111 may be formed on the gate insulating film 401 by using a photolithographic method.

A source electrode and a drain electrode are formed on the insulating film 401 on which the channel gap 111 is formed by using a coating method (FIG. 3C). The source electrode and the drain electrode are isolated by performing a water repelling treatment on the upper surface of the channel gap 111 to form a channel domain.

The surface of the gate insulating film 400 formed in a) and the surface of the gate insulating film 401 formed in b) are disposed substantially on a same plane (FIG. 3B). Accordingly, forming of the gate insulating film 400 in a) and forming of the gate insulating film 401 in b) may be performed at the same time by coating. In this case, the viscosity of an ink containing a material of the gate insulating film to be applied is adjusted to a level such that the ink flows into a groove connecting the top-gate type TFT 11 and the bottom-gate type TFT 12.

In the step 3) the gate electrode 230 of the top-gate type TFT 11 and the drain electrode 221 and the source electrode 211 of the bottom-gate type TFT 12 are formed by a coating method (FIG. 3C). As shown in FIG. 3C, the gate electrode 230 of the top-gate type TFT 11 and the drain electrode 221 and the source electrode 211 of the bottom-gate type TFT 12 are disposed on a same plane. Further, the gate electrode 230 is connected with the drain electrode 221 via the groove 130 and the groove 131. An ink containing an electrode material (an ink containing Ag nanoparticles and an organic binder, for example) can be applied to a domain defined by the bank 120, the groove 130, the groove 131, the bank 121 and the channel gap 111, by using an inkjet method and the like. The applied ink is then dried and solidified to form the gate electrode 230, the drain electrode 221 and the source electrode 211 all together.

In the case where the upper surface of the channel gap 111 of the bottom-gate type TFT 12 is subjected to a water repelling treatment, the water repelling property may be removed by heating or washing after the gate electrode 230, the drain electrode 221 and the source electrode 211 are formed together by coating. Of course, the water repelling property may be removed while the ink containing the electrode material is dried.

In the step 4) the organic semiconductor layer 301 is formed on the source electrode 211 and the drain electrode 221 of the bottom-gate type TFT 12 within the domain defined by the bank 121, by applying an ink containing an organic semiconductor material to the domain using an inkjet method and the like. The applied ink is then dried and solidified (FIG. 3D). In this case, the viscosity of the ink applied is adjusted to a level such that the ink does not flow into a groove connecting the driving TFT 11 and the switching TFT 12.

In this way, in the semiconductor device of the present invention, the gate electrode 230 of the top-gate type TFT 11 and the drain electrode 221 and the source electrode 211 of the bottom-gate type TFT 12 can be formed together by coating, which serves to reduce the number of production processes and the production cost. Accordingly, a low cost semiconductor device can be provided according to the present invention.

The Second Embodiment

Figure 6:
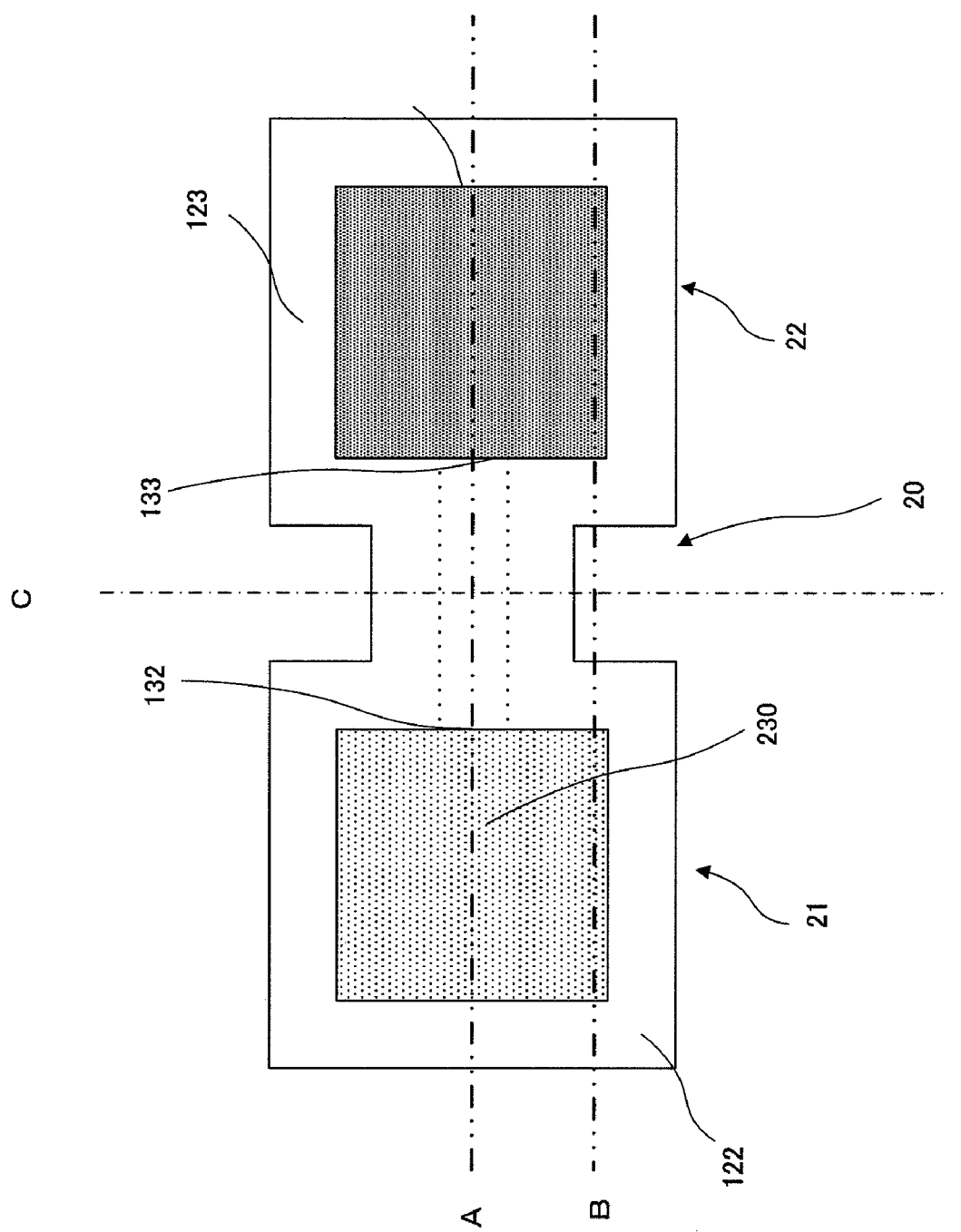
FIG. 6 is a plane view of a semiconductor device of the second embodiment.
Figure 7A:
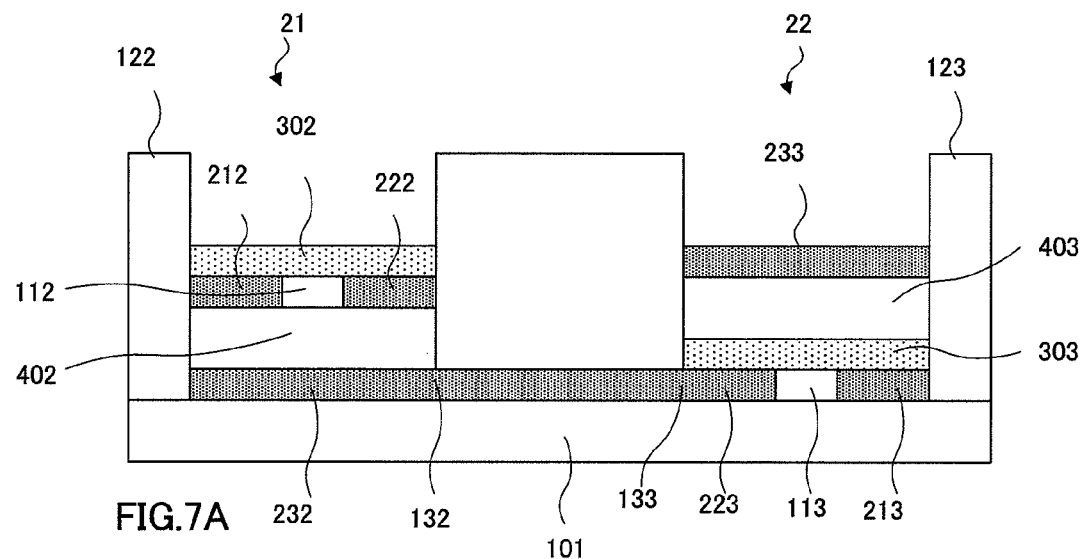
FIG. 7A is a cross-sectional view of line A across the semiconductor device of the second embodiment.
Figure 7B:
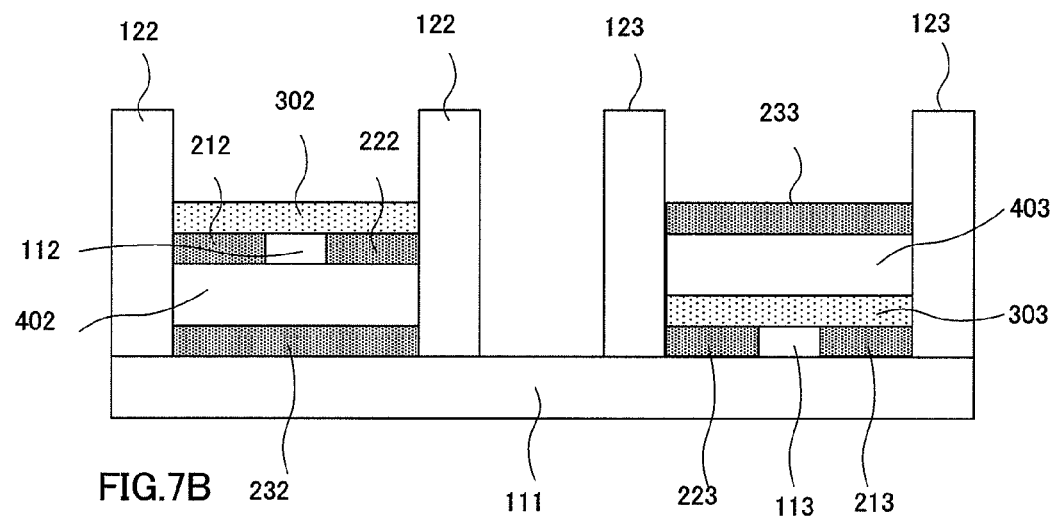
FIG. 7B is a cross-sectional view of line B across the semiconductor device of the second embodiment.
Figure 7C:
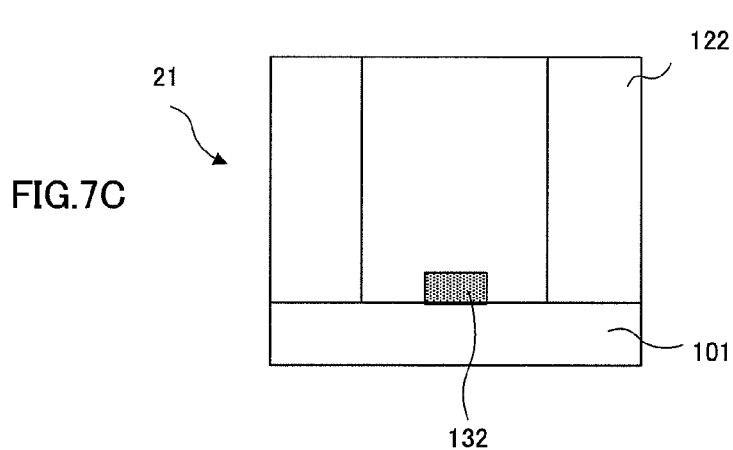
FIG. 7C is a cross-sectional view of line C across the semiconductor device of the second embodiment.

A semiconductor device having a hole through a bank will be explained in the second embodiment. FIG. 6 shows a plane view of the semiconductor device according to the second embodiment. FIGS. 7A, 7B and 7C each show a cross-sectional view of the semiconductor device according to the second embodiment.

In FIG. 6 and FIG. 7, The semiconductor device 20 is provided with a bottom-gate type TFT 21 and a top-gate type TFT 22.

1. Bottom-Gate Type TFT 21

The bottom-gate type TFT 21 is provided with substrate 101, a gate electrode 232, a gate insulating film 402, a source electrode 212 and a drain electrode 222, channel gap 112, an organic semiconductor layer 302 and a bank 122.

The substrate 101 of the bottom-gate type TFT 21 is a PET film, for example. The gate electrode 232 is disposed on the substrate 101. The material of the gate electrode 232 is silver, for example. The gate insulating film 402 is disposed on the gate electrode 232. The source electrode 212 and the drain electrode 222 are disposed on the gate insulating film 402. The material of the source electrode 212 and the drain electrode 222 is silver, for example.

The channel gap 112 is disposed between the source electrode 212 and the drain electrode 222. The height of the channel gap is 0.01 to 10 μm and width of the channel gap is 1 to 50 μm. The material of the channel gap 112 may be the same as that of the gate insulating film 402 or different from that of the gate insulating film 402. The organic semiconductor layer 302 is disposed on the source electrode 212, the drain electrode 222 and the channel gap 112.

The bank 122 is disposed on the substrate 101 so as to define a domain enclosing the gate insulating film 402, the source electrode 212, the drain electrode 222 and the organic semiconductor layer 302. The height of the bank 122 is 0.1 to 5 μm. The material of the bank 122 is PET, for example. A hole 132 is formed through the bank 122 (FIGS. 7A and 7C). The hole 132 is connected with a hole 133 of the top-gate type TFT 22 described later (FIG. 7A). Through the hole 132 and the hole 133, the gate electrode 232 and the drain electrode 223 can be disposed on a same plane while they are connected. The width of the hole 132 formed through the bank 122 is preferably 3 to 200 μm and height of the hole 132 is preferably 20 to 200 nm.

2. Top-gate Type TFT 22

The top-gate type TFT 22 is provided with substrate 101, the source electrode 213 and the drain electrode 223, the channel gap 113, organic semiconductor layer 303, the gate insulating film 403, the gate electrode 233 and the bank 123.

The substrate 101 is the same as the substrate of the bottom-gate type TFT 21, which means that the bottom-gate type TFT 21 and the top-gate type TFT 22 share the substrate 101. The source electrode 213 and the drain electrode 223 are disposed on the substrate 101. The material of the source electrode 213 and the drain electrode 223 is silver, for example. The channel gap 113 is disposed between the material of the channel gap 113 is PET, for example. The height of the channel gap is 0.01 to 10 μm and width of the channel gap is 1 to 50 μm. The organic semiconductor layer 303 is disposed on the source electrode 213, the drain electrode 223 and the channel gap 113. The gate insulating film 403 is disposed on the organic semiconductor layer 303. The gate electrode 233 is disposed on the gate insulating film 403. The material of the gate electrode 233 is silver, for example.

The bank 123 is disposed on the substrate 101 so as to define a domain enclosing the organic semiconductor layer 303, the gate insulating film 403 and the gate electrode 233. Further, a hole 133 is formed through the bank 123 (FIG. 7A). The hole 133 is connected with the hole 132 of the bottom-gate type TFT 21 described above (FIG. 7A). Through the hole 132 and the hole 133, the drain electrode 223 and the gate electrode 232 of the bottom-gate type TFT 21 can be disposed on a same plane while they are connected.

3. Method for Producing the Semiconductor Device 20

Figure 8A:
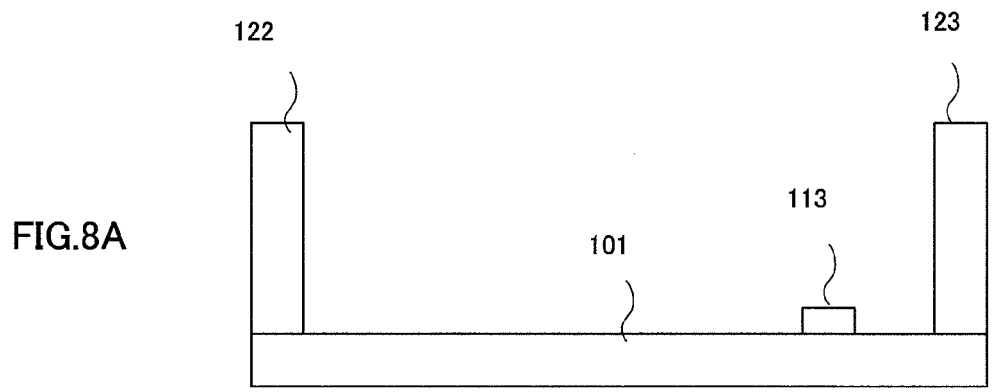
FIG. 8 is a diagram showing a production process of the semiconductor device of the second embodiment.
Figure 8B:
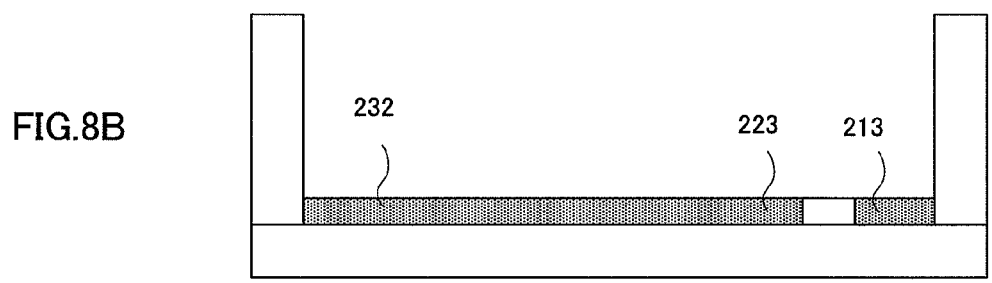
Figure 8C:
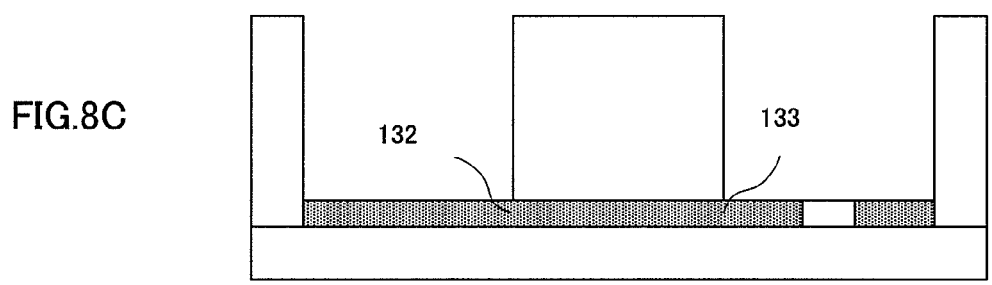
Figure 8D:
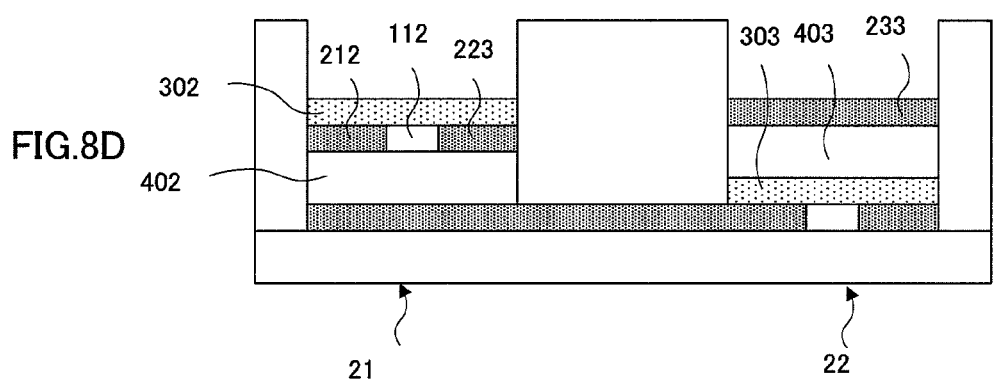

The method for producing the semiconductor device 20 includes, for example, steps of 1) forming the substrate 101 appropriately by an imprinting process (FIG. 8A),
2) forming the gate electrode 232, the drain electrode 223, and the source electrode 213 (FIG. 8B),
3) filling the grooves through the bank 122 and the bank 123 (FIG. 8C) and
4) forming the gate insulating film 402, the channel gap 112 and the semiconductor layer 302 of the bottom-gate type TFT 21, and organic semiconductor layer 303, the gate insulating film 403 and the gate electrode 233 of the top-gate type TFT 22 (FIG. 8D).

Step 1) is performed by imprint processing of the substrate 101 to form the bank 123 and the channel gap 113 of the top-gate type TFT 22, and to form the bank 122 of the bottom-gate type TFT 21. Further, the bank 122 and the bank 123 in Step 1) have grooves enabling to form the gate electrode 232 and the drain electrode 223 described later connected on a same plane.

In the step 2) the gate electrode 232 of the bottom-gate type TFT 21 and the drain electrode 223 and the source electrode 213 of the top-gate type TFT 22 are formed by a coating method (FIG. 8B). As shown in FIG. 8B, the gate electrode 232 of the bottom-gate type TFT 21 and the drain electrode 223 and the source electrode 213 of the top-gate type TFT 22 are disposed on a same plane. Further, the gate electrode 232 is connected with the drain electrode 223 through the groove formed through the bank 122 and the bank 123. An ink containing an electrode material (an ink containing Ag nanoparticles and an organic binder, for example) can be applied to a domain defined by the bank 122, the groove, the bank 123 and the channel gap 113, by using an inkjet method and the like. The applied ink is then dried and solidified to form the gate electrode 232, the drain electrode 223 and the source electrode 213 all together. The upper surface of the channel gap 113 is preferably subjected to a water repelling treatment in advance. By subjecting the upper surface of the channel gap 113 to a water repelling treatment in advance, the source electrode 213 and the drain electrode 223 formed by a coating method are definitely separated to form a channel domain.

In the case where the upper surface of the channel gap 113 of the top-gate type TFT 22 is subjected to a water repelling treatment, the water repelling property may be removed by heating or washing after the gate electrode 232, the drain electrode 223 and the source electrode 213 are formed together by coating. Of course, the water repelling property may be removed while the ink containing the electrode material is dried.

In the step 3) the groove formed through the bank 122 and the bank 123 is filled in. By filling in the groove formed through the bank 122 and the bank 123, the domain enclosing the organic semiconductor layer 302 and the like can be defined more accurately. The material used to fill in the groove formed through the bank 122 and the bank 123 may be the same as that of the bank 122 and the bank 123. The groove formed through the bank 122 and the bank 123 is preferably filled in by a photolithographic method. The hole 132 and the hole 133 are formed by filling in the groove formed through the bank 122 and the bank 123.

The step 4) includes forming a) a member of the bottom-gate type TFT 21 and b) a member of the top-gate type TFT 22. The first embodiment may be referred to as the method for forming each member.

In this way, in the semiconductor device of the present invention, the gate electrode 232 of the bottom-gate type TFT 21 and the drain electrode 223 and the source electrode 213 of the top-gate type TFT 22 can be formed together by coating, which serves to reduce the number of product ion processes and the production cost. Accordingly, a low cost semiconductor device can be provided according to the present invention.

The Third Embodiment

In the third embodiment, an organic EL device 30 composed of organic luminescent element 31 is connected to the semiconductor device 20 of the second embodiment. In the third embodiment, the bottom-gate type TFT 21 of the semiconductor device 20 is used as a driving TFT and the top-gate type TFT 22 is used as a switching TFT, respectively. Namely, the drain electrode 222 of the bottom-gate type TFT 21 is connected with an anode 240 of the organic luminescent element 31.

Figure 9:
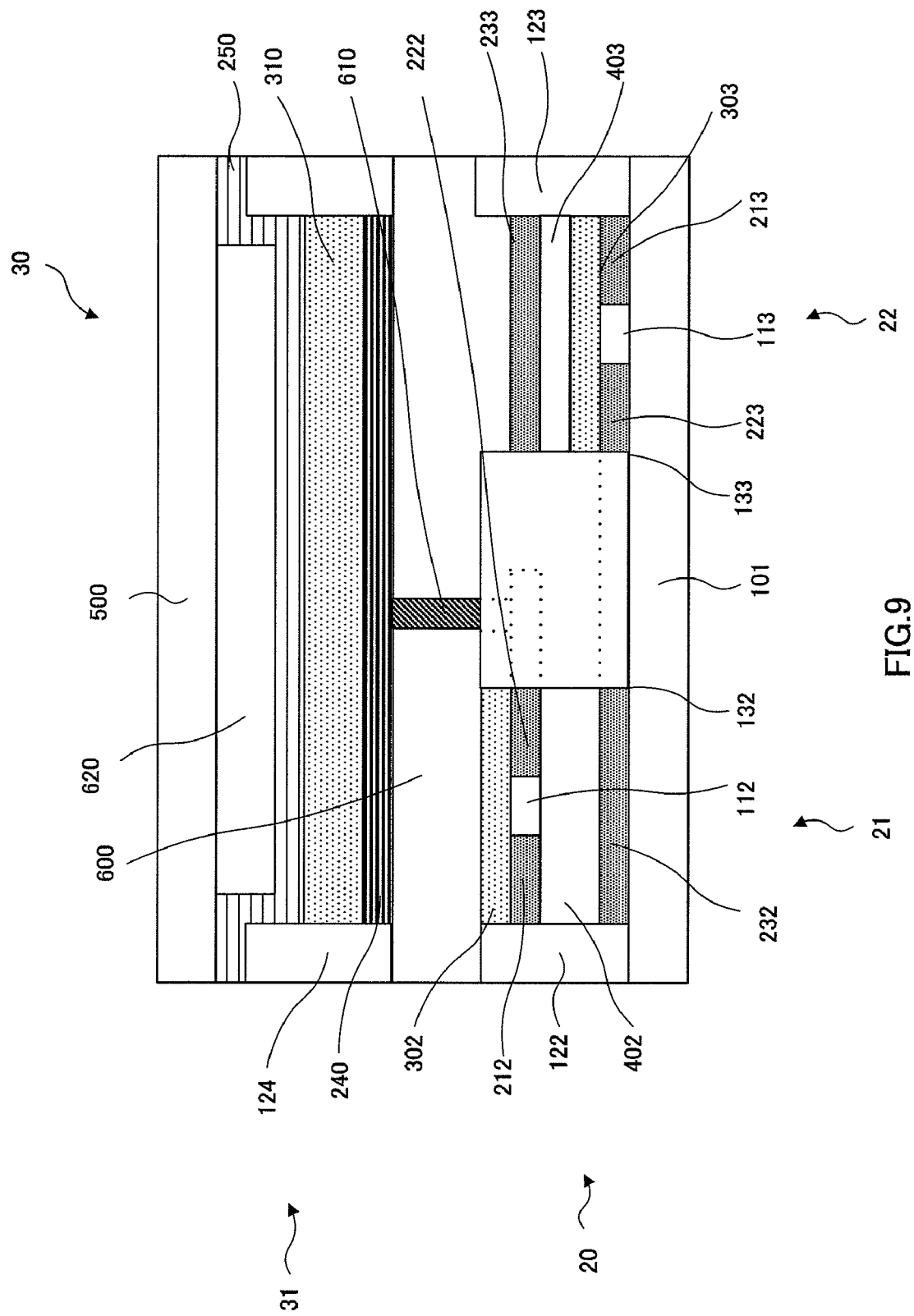
FIG. 9 is a cross-sectional view of an organic EL device of the third embodiment.

FIG. 9 is a cross-sectional view of the organic EL device 30. For those constitutional elements duplicating with those of the semiconductor device 20 of the second embodiment, the identical symbols are assigned and their explanation is omitted.

The luminescent element 31 is provided with the anode 240, an organic luminescent layer 310, a cathode 250, a sealing film 500, a planarization layer 600, a contact hole 610, a planarization film 620, and a bank 124. Further, the luminescent element 31 is a top-emission type luminescent element.

The planarization layer 600 is an insulating layer disposed on the semiconductor device 20. Examples of the material of the planarization layer 600 include acrylic resin, BCB resin, novolak resin and the like. Further, a film made of parylene, $Si_3N_4$, $SiO_2$ and the like is preferably disposed between the planarization layer 600 and the semiconductor device 20 in order to protect the semiconductor device 20. The planarization layer 600 is formed by a spin coating method, for example. The protecting film of the semiconductor device 20 may be formed by a vapor deposition method, CVD and the like. Further, the planarization layer 600 is provided with the contact hole 610 to connect the semiconductor device 20 with the luminescent element 31. The contact hole 610 may be formed by a photolithographic method when the material of the planarization layer 600 is a photosensitive resin, or may be formed by a dry-etching method when material of the planarization layer 600 is not a photosensitive resin. A conductive layer connecting the drain electrode 222 of the bottom-gate type TFT 21 and the anode 240 is formed by sputtering a conductive material such as a metal in the contact hole 610.

The anode 240 is a conductive layer disposed on the planarization layer 600. The anode 240 is connected with the drain electrode 222 of the bottom-gate type TFT 21 via the contact hole 610. In the semiconductor device 20, the drain electrode 222 of the bottom-gate type TFT 21 is extended into the inside of the bank. The contact hole 610 may be connected with the extended drain electrode 222. The anode 240 is preferably a reflective anode made of silver and the like.

The organic luminescent layer 310 contains an organic luminescent material. Examples of the organic luminescent material contained in the organic luminescent layer include a poly(phenylene vinylene) and a derivative thereof, a polyacetylene and a derivative thereof, a polyphenylene and a derivative thereof, a poly(para-phenylene ethylene) and a derivative thereof, a poly(3-hexylthiophene) and a derivative thereof, a polyfluorene and a derivative thereof, and the like. The organic luminescent layer 310 may further contain a hole injecting layer, an intermediate layer, an electron transporting layer, and the like.

The cathode 250 is a conductive layer disposed on the organic luminescent layer 310. The cathode 250 is preferably made of an optically transparent material. On the cathode 250 a planarization film 620 is further disposed. The material of the planarization film 620 and its method for production may be the same as those of the planarization layer 600.

The sealing film 500 is a film for protecting the anode 240, the organic luminescent layer 310 and the cathode 250 from moisture, heat, mechanical shock and the like. The sealing film 500 is disposed on the planarization layer 620 and the cathode 250. Examples of the material of the sealing film 500 include SiN, SiON and the like. A preferable material of the sealing film 500 is SiN. The thickness of the sealing film 500 is preferably 20 to 200 nm.

The bank 124 defines a domain enclosing the anode 240, the organic luminescent layer 310, and the planarization layer 620. The material of the bank 124 is PET, for example.

The present application claims a priority based on Japanese Patent Application No. 2006-339651 filed on Dec. 18, 2006. The contents described in the application description are all incorporated herein.

INDUSTRIAL APPLICABILITY

The semiconductor device and the method for its production according to the present invention are useful in flexible displays and production of low-cost semiconductor devices.

The invention claimed is:

1. Semiconductor device comprising an organic semiconductor element A and an organic semiconductor element B, wherein
   the organic semiconductor element A has a source electrode and a drain electrode disposed on a surface of a substrate; a channel gap disconnecting the source electrode and the drain electrode; an organic semiconductor layer disposed on the source electrode, the drain electrode and the channel gap; an insulating film disposed on the organic semiconductor layer; a gate electrode disposed on the insulating film; a bank defining the organic semiconductor layer; and a groove through the bank,
   a distance between the apex of the bank and the surface of a substrate is greater than a distance between the apex of the channel gap and the surface of the substrate, and
   the organic semiconductor element B has a source electrode or a drain electrode connected with the gate electrode of the organic semiconductor element A via the groove through the bank of the organic semiconductor element A.

2. The semiconductor device according to claim 1, wherein the gate electrode of the organic semiconductor element A and the source electrode or the drain electrode of the organic semiconductor element B are disposed on a same plane.

3. The semiconductor device according to claim 1, wherein
   the organic semiconductor element B has a gate electrode disposed on the surface of a substrate; an insulating film disposed on the gate electrode; a source electrode and a drain electrode disposed on the insulating film; an organic semiconductor layer disposed on the source electrode and the drain electrode; a bank defining the organic semiconductor layer; and a groove through the bank, which communicates with the groove through the bank of the organic semiconductor element A, and
   the gate electrode of the organic semiconductor element A is connected with the source electrode or the drain electrode of organic semiconductor element B via the groove for the communicating.

4. The semiconductor device according to claim 1, wherein the width of the groove is 3 to 200 μm.

5. An organic EL device comprising the semiconductor device according to claim 1 and an organic luminescent element having a pixel electrode connected to the drain electrode of the organic semiconductor element A.

6. A semiconductor device comprising an organic semiconductor element A and an organic semiconductor element B, wherein
   the organic semiconductor element A has a source electrode and a drain electrode disposed on a surface of a substrate; a channel gap disconnecting the source electrode and the drain electrode; an organic semiconductor layer disposed on the source electrode, the drain electrode and the channel gap; an insulating film disposed on the organic semiconductor layer, a gate electrode disposed on the insulating film; a bank defining the organic semiconductor layer, and a hole through the bank,
   a distance between the apex of the bank and the surface of the substrate is greater than a distance between the apex of the channel gap and the surface of the substrate,
   the organic semiconductor element B, has a gate electrode connected with the source electrode or the drain electrode of the organic semiconductor element A via the hole through the bank of the organic semiconductor element A,
   the source electrode or the drain electrode of the organic semiconductor element A and the gate electrode of the organic semiconductor element B are disposed on a plane, and
   the hole extends along the plane.

7. The semiconductor device according to claim 6, wherein
   the organic semiconductor element B has a gate electrode disposed on the surface of the substrate; an insulating film disposed on the gate electrode; a source electrode and a drain electrode disposed on the insulating film; an organic semiconductor layer disposed on the source electrode and the drain electrode; a bank defining the organic semiconductor layer, and a hole through the bank, which communicates with the hole through the bank of the organic semiconductor element A, and
   the source electrode or the drain electrode of the organic semiconductor element A is connected with the gate electrode of the organic semiconductor element B via the hole for the communicating.

8. The semiconductor device according to claim 6, wherein the width of the hole is 3 to 200 μm and the height of the hole is 20 to 200 nm.

9. An organic EL device comprising the semiconductor device according to claim 6 and an organic luminescent element having a pixel electrode connected to the drain electrode of the organic semiconductor element B.

* * * * *